US012746959B2

(12) United States Patent
Verellen et al.

(10) Patent No.: US 12,746,959 B2
(45) Date of Patent: Sep. 29, 2026

(54) RAILWAY MANAGEMENT SYSTEM WITH BRAKE CALCULATION AND RELATED METHOD

(71) Applicant: WSP GLOBAL INC., Montreal (CA)

(72) Inventors: Jennifer Verellen, Montreal (CA); Mustafa Mirza, Montreal (CA); Herman Won, Montreal (CA); Cindy Genkin, Montreal (CA); Grant Markewitz, Montreal (CA); Gina Giron, Montreal (CA)

(73) Assignee: WSP GLOBAL INC., Montreal (CA)

( * ) Notice: Subject to any disclaimer, the term of this patent is extended or adjusted under 35 U.S.C. 154(b) by 1134 days.

(21) Appl. No.: 17/781,756

(22) PCT Filed: Dec. 2, 2020

(86) PCT No.: PCT/CA2020/051651
§ 371 (c)(1),
(2) Date: Jun. 2, 2022

(87) PCT Pub. No.: WO2021/108905
PCT Pub. Date: Jun. 10, 2021

(65) Prior Publication Data

US 2023/0024017 A1 Jan. 26, 2023

Related U.S. Application Data

(60) Provisional application No. 62/942,395, filed on Dec. 2, 2019, provisional application No. 62/942,374, filed
(Continued)

(51) Int. Cl.
*B61L 27/20* (2022.01)
*B61K 7/12* (2006.01)
(Continued)

(52) U.S. Cl.
CPC ................ *B61L 27/20* (2022.01); *B61K 7/12* (2013.01); *B61L 27/53* (2022.01);
(Continued)

(58) Field of Classification Search
CPC ..... B61K 7/12; G06F 3/04815; G06F 3/0482; G06F 3/0484; G06F 30/13; G06F 30/15;
(Continued)

(56) References Cited

U.S. PATENT DOCUMENTS 2,280,891 A 4/1942 Caille
3,112,908 A 12/1963 Hailes
(Continued)

FOREIGN PATENT DOCUMENTS

CA 2665485 A1 4/2008
CN 102975743 B 4/2015
(Continued)

OTHER PUBLICATIONS

A IEEE Guide for the Calculation of Braking Distances for Rail Transit Vehicles, in IEEE Std 1698-2009 , vol. No., pp. 1-41, Nov. 6, 2009, doi: 10.1109/IEEESTD.2009.5332051. https://ieeexplore.ieee.orgfstamp/stamp.jsp?arnumber=5332051&tag=1.
(Continued)

*Primary Examiner* — Zachary L Kuhfuss
(74) *Attorney, Agent, or Firm* — NORTON ROSE FULBRIGHT CANADA LLP

(57) ABSTRACT

Systems and methods for determining braking distances and systems and methods for positioning of wayside signals are described herein. A graphical user interface is operated for selecting at least one wayside signal of a railway. At least one selected wayside signal is received via the graphical user interface. Railway parameters indicative of a configuration of the railway and one or more rail transit vehicles operable on the railway are obtained based on the at least
(Continued)

one selected wayside signal. At least one braking distance is determined based on the railway parameters and the at least one selected wayside signal. The at least one braking distance is displayed on the graphical user interface.

19 Claims, 13 Drawing Sheets

Related U.S. Application Data on Dec. 2, 2019, provisional application No. 62/942,413, filed on Dec. 2, 2019.

(51) Int. Cl.

| | |
|---|---|
| ***B61L 27/53*** | (2022.01) |
| ***G06F 3/04815*** | (2022.01) |
| ***G06F 3/0482*** | (2013.01) |
| ***G06F 3/0484*** | (2022.01) |
| ***G06F 30/13*** | (2020.01) |
| ***G06F 30/15*** | (2020.01) |
| ***G06F 30/18*** | (2020.01) |

(52) U.S. Cl.
CPC ........ *G06F 3/04815* (2013.01); *G06F 3/0482* (2013.01); *G06F 3/0484* (2013.01); *G06F 30/13* (2020.01); *G06F 30/15* (2020.01); *G06F 30/18* (2020.01)

(58) Field of Classification Search
CPC ........ G06F 30/18; G06Q 50/40; G06Q 10/20; G06Q 10/10; B61L 27/20; B61L 15/0027; B61L 27/70; B61L 25/025; B61L 27/53; B61L 2205/04; B61L 15/0072; B61L 15/0081; B61L 27/40; B61L 15/0062
USPC .............................................................. 701/19
See application file for complete search history.

(56) References Cited

U.S. PATENT DOCUMENTS

| | | | | |
|---|---|---|---|---|
| 3,582,644 | A | 6/1971 | Schatzel | |
| 3,700,888 | A | 10/1972 | Thompson | |
| 3,740,549 | A | 6/1973 | Thorne | |
| 4,302,811 | A | 11/1981 | McElhenny | |
| 5,533,695 | A * | 7/1996 | Heggestad | B61L 27/20 701/19 |
| 5,744,707 | A * | 4/1998 | Kull | B61L 15/0062 73/121 |
| 6,559,774 | B2 | 5/2003 | Bergan et al. | |
| 7,188,057 | B2 * | 3/2007 | Birkelbach | G05B 17/02 701/19 |
| 8,019,496 | B2 * | 9/2011 | Matusiak, Jr. | B61L 15/009 701/19 |
| 8,538,611 | B2 * | 9/2013 | Kumar | B61L 27/16 700/291 |
| 8,781,803 | B2 * | 7/2014 | Rio | B61L 19/06 701/19 |
| 2002/0062181 | A1 * | 5/2002 | Polivka | B61L 27/20 701/19 |
| 2003/0016143 | A1 | 1/2003 | Ghazarian | |
| 2022/0063690 | A1 * | 3/2022 | Hogg | B61L 27/40 |

FOREIGN PATENT DOCUMENTS

| | | | |
|---|---|---|---|
| DE | 3337183 | A1 | 4/1985 |
| DE | 10147459 | A1 | 6/2005 |
| EP | 2663483 | B1 | 3/2015 |
| GB | 1426262 | A | 2/1976 |
| JP | 8127344 | A | 5/1996 |

OTHER PUBLICATIONS

Australian Stopdist Train Braking Calculation Tool User Guide, Rail track Corporation Limited(ATRC), ESI-05-12, Version No. 1.0, Jun. 19, 2017. https://extranet.artc.com.au/docs/eng/signal/tools/ESI-05-12.pdf.

Calculating Train Braking Distance; Barney et al.; 2001.

* cited by examiner

Summary of Braking Calculation

| | |
|---|---|
| **Entry Signal:** | 668 |
| **Exit Signal:** | 602 |
| **Proposed Entry Move:** | 72 ft |
| **Proposed Exit Move:** | 30 ft |
| **Distance Between Signals (old):** | 505 ft |
| **Distance Between Signals (new):** | 404 ft |

| | GO | VIA | CN Passenger | CN Freight |
|---|---|---|---|---|
| **Original Location** | | | | |
| Grade (%) | 0.3 | 0.3 | 0.31 | 0.03 |
| Braking % | 109% | 124% | 73% | 37% |
| Original Max Speed (mph) | 15 | 15 | 10 | 0 |
| New Max Speed (mph) | 15 | 20 | 14 | 8 |
| Track Speed Limit (mph) | 15 | 15 | 15 | 15 |
| Move Possible | Y | Y | N | N |
| **Signal 668 Moved** | | | | |
| Grade (%) | 0.3 | 0.3 | 0.31 | 0.03 |
| Braking % | 93% | 106% | 62% | 32% |
| Original Max Speed (mph) | 10 | 15 | 10 | 0 |
| New Max Speed (mph) | 15 | 20 | 14 | 8 |
| Track Speed Limit (mph) | 15 | 15 | 15 | 15 |
| Move Possible | N | Y | N | N |
| **Signal 602 Moved** | | | | |
| Grade (%) | 0.3 | 0.3 | 0.31 | 0.03 |
| Braking % | 102% | 117% | 69% | 35% |
| Original Max Speed (mph) | 15 | 15 | 10 | 0 |
| New Max Speed (mph) | 15 | 20 | 14 | 8 |
| Track Speed Limit (mph) | 15 | 15 | 15 | 15 |
| Move Possible | Y | Y | N | N |
| **Both Signals Moved** | | | | |
| Grade (%) | 0.3 | 0.3 | 0.31 | 0.03 |
| Braking % | 87% | 99% | 58% | 29% |
| Original Max Speed (mph) | 10 | 10 | 10 | 0 |
| New Max Speed (mph) | 15 | 20 | 14 | 8 |
| Track Speed Limit (mph) | 15 | 15 | 15 | 15 |
| Move Possible | N | N | N | N |

| | 1st | 2nd |
|---|---|---|
| Move Order | 602 | 668 |

FIGURE 3G

RAILWAY MANAGEMENT SYSTEM WITH BRAKE CALCULATION AND RELATED METHOD

CROSS-REFERENCE TO RELATED APPLICATIONS

The present application claims priority from U.S. Patent Application No. 62/942,395, filed on Dec. 2, 2019, from U.S. Patent Application No. 62/942,374, filed Dec. 2, 2019, and from U.S. Patent Application No. 62/942,413, filed Dec. 2, 2019, the entire contents of which are incorporated herein by reference.

TECHNICAL FIELD

The present disclosure relates generally to railway management systems, and, more particularly, to railway management systems that implement braking calculations.

BACKGROUND OF THE ART

For a rail transit vehicle to safely travel on a railway, the rail transit vehicle requires a certain distance to stop from the moment the brakes are applied. Wayside signals are positioned at fixed locations along the railway to direct railway traffic and are used to provide an indication of when an operator or emergency operating system of the rail transit vehicle should apply the brakes in order to be able to stop the rail transit vehicle before a particular location.

During the design phase of a railway, a designer is tasked with positioning the wayside signals at various locations along the railway. Traditionally, the designer manually decides the positions of the wayside signals and manually performs a braking calculation to determine that the braking distance of the rail transit vehicle is sufficient from the wayside signal to a stop location of a subsequent wayside signal.

However, when the braking calculation is performed manually, every time a wayside signal is moved during the design, installation or repair phase, the manual braking calculation needs to be repeated, which is a complex and time consuming operation. Furthermore, the manual braking calculation may be subject to human calculation error; if the braking calculation is performed incorrectly, the safety of the railway may be compromised. Moreover, when the wayside signals are being physically installed, some of the wayside signals may not be physically installed at the location as planned, which may result in wayside signals not being sufficiently positioned according to the braking distance.

As such, there is a need for computer-implemented rail management systems and methods for positioning wayside signals.

SUMMARY

The present disclosure is generally drawn to computer-implemented railway management systems and related methods for determining braking distances and for positioning wayside signals based on braking distances on a graphical user interface, for example, during a design and/or installation phase of the railway.

In accordance with one broad aspect, there is provided a computer-implemented method for determining one or more braking distances. The method comprises: operating a graphical user interface for selecting at least one wayside signal of a railway; receiving at least one selected wayside signal via the graphical user interface; obtaining railway parameters indicative of a configuration of the railway and one or more rail transit vehicles operable on the railway based on the at least one selected wayside signal; determining at least one braking distance based on the railway parameters and the at least one selected wayside signal; and displaying on the graphical user interface the at least one braking distance.

In some embodiments, for example, the method includes generating at least one alert indicating that the at least one braking distance is insufficient.

In some embodiments, the method includes generating a braking distance report having the at least one braking distance.

In some embodiments, for example, generating the braking distance report is performed responsive to receiving a request to generate the braking report via the graphical user interface.

In some embodiments, for example, generating the braking distance report having the at least one braking distance includes generating a comparison between a first braking distance associated with a first selected wayside signal and a second braking. distance associated with proposed subsequent location of the first selected wayside signal.

In some embodiments, for example, determining the at least one braking distance is based on at least one of operating conditions and a type of the one or more rail transit vehicles.

In some embodiments, for example, the method includes receiving a request to move a given wayside signal of the at least one selected wayside signal, and wherein determining the at least one braking distance includes determining the at least one braking distance based on a moved location of the given wayside signal.

In some embodiments, for example, receiving the request to move the given wayside signal includes receiving an input via a modal window of the graphical user interface.

In some embodiments, for example, receiving the request to move the given wayside signal includes receiving a GPS location from an onsite marker.

In some embodiments, for example, identifying at least one additional wayside signal to be moved based on the request.

In some embodiments, for example, the method includes displaying on the graphical user interface a proposed new location for the at least one additional wayside signal to be moved.

In some embodiments, for example, the method includes generating a visualization of the given wayside signal at the moved location.

In some embodiments, for example, receiving the at least one selected wayside signal via the graphical user interface includes receiving a request via the graphical user interface to obtain the at least one selected wayside signal from a remote computing device based on a GPS signal.

In some embodiments, for example, receiving the at least one selected wayside signal via the graphical user interface includes receiving a block having an entry wayside signal and an exit wayside signal.

In some embodiments, for example, the method includes determining the at least one braking distance based on the railway parameters and the at least one selected wayside signal includes comparing a distance of the block to the at least one braking distance.

In some embodiments, for example, the method includes generating at least one alert indicating that the distance of the block is insufficient if the distance of the block is less than the braking distance.

In accordance with another broad aspect, there is provided a system for determining one or more braking distances. The system comprises a processor and a non-transitory computer-readable medium. The non-transitory computer-readable medium has computer-executable instructions stored thereon which cause the process to implement the method according any to any of the preceding embodiments.

In accordance with a further broad aspect, there is provided a computer-implemented method for positioning of wayside signals. The method comprises: providing a graphical user interface for selecting a position of a first wayside signal for a railway; receiving a selected position of the first wayside signal via the graphical user interface; obtaining railway parameters indicative of a configuration of the railway and one or more rail transit vehicles operable on the railway; determining a braking distance based on the railway parameters and the selected position of the first wayside signal; determining a proposed position of a second wayside signal for the railway based on the braking distance; and displaying on the graphical user interface the proposed position of the second wayside signal.

In some embodiments, for example, the method includes generating a braking report based on the railway parameters and the selected position of the first wayside signal.

In some embodiments, for example, generating the braking report is performed responsive to receiving a request to generate the braking report via the graphical user interface.

In some embodiments, for example, the method includes: receiving a request to modify the selected position of the first wayside signal to a subsequent position; determining a subsequent braking distance based on the railway parameters and the subsequent position; determining a subsequent proposed position of the second wayside signal; and updating the graphical user interface to display the subsequent proposed position.

In some embodiments, for example, the method includes generating a comparison based on the selected position and the subsequent position and displaying the result of the comparison on the graphical user interface.

In some embodiments, for example, the method includes generating the comparison includes identifying a difference between the braking distance and the subsequent braking distance.

In some embodiments, for example, receiving the request to move the given wayside signal includes receiving an input via a modal window of the graphical user interface.

In some embodiments, for example, receiving the request to move the given wayside signal includes receiving a GPS location from an onsite marker.

In some embodiments, for example, the method includes identifying at least one additional wayside signal to be moved based on the request.

In some embodiments, for example, the method includes displaying on the graphical user interface a proposed new location for the at least one additional wayside signal to be moved.

In some embodiments, for example, the method includes generating a visualization of the given wayside signal at the subsequent position.

In some embodiments, for example, receiving the selected position of the first wayside signal via the graphical user interface includes receiving a request via the graphical user interface to obtain the selected position from a remote computing device based on a GPS signal.

In some embodiments, for example, determining the at least one braking distance is based on at least one of operating conditions and a type of the one or more rail transit vehicles.

In accordance with another broad aspect, there is provided a system for determining one or more braking distances. The system comprises a processor and a non-transitory computer-readable medium. The non-transitory computer-readable medium has computer-executable instructions stored thereon which cause the process to implement the method according any to any of the preceding embodiments.

In accordance with a further broad aspect, there is provide computer-implemented method for positioning of wayside signals. The method comprises: operating a graphical user interface of a railway having a plurality of blocks, each said block having an entry wayside signal and an exit wayside signal; receiving a request to modify a position of a wayside signal of a first block via the graphical user interface, to a proposed position; obtaining railway parameters indicative of a configuration of the railway and one or more rail transit vehicles operable on the railway; determining at least one braking distance based on the railway parameters and the proposed position of the wayside signal in the first block; and displaying on the graphical user interface the at least one braking distance.

In some embodiments, for example, the method includes indicating that the distance of the first block including the proposed position for the wayside signal is insufficient if the distance of the first block is less than the braking distance.

In some embodiments, for example, the first block is adjacent to a second block, and wherein receiving the request to modify the position of the wayside signal of the first block to the proposed position causes a change of position of a wayside signal of the second block to an adjusted position.

In some embodiments, for example, the method includes determining at least one braking distance based on the railway parameters and the adjusted position of the wayside signal in the second block, and further indicating that the distance of the second block including the adjusted position for the wayside signal is insufficient if the distance of the second block is less than the braking distance.

In some embodiments, for example, the first block and the second block are end to end, and the proposed position of the wayside signal of the first block is for the exit wayside signal of the first block, and the adjusted position of the wayside signal of the second block is for the entry wayside signal of the second block.

In some embodiments, for example, the first block and the second block are end to end, and the proposed position of the wayside signal of the first block is for the entry wayside signal of the first block, and the adjusted position of the wayside signal of the second block is for the exit wayside signal of the second block.

In some embodiments, for example, the method includes generating a braking distance report having the at least one braking distance.

In some embodiments, for example, generating the braking distance report is performed responsive to receiving a request to generate the braking report via the graphical user interface.

In some embodiments, for example, generating the braking distance report having the at least one braking distance includes generating a comparison between a first braking distance associated with a first selected wayside signal and a second braking distance associated with proposed subsequent location of the first selected wayside signal in the first block.

In some embodiments, for example, determining the at least one braking distance is based on at least one of operating conditions and a type of the one or more rail transit vehicles.

In some embodiments, for example, receiving the request to modify the position of the wayside signal includes receiving an input via a modal window of the graphical user interface.

In some embodiments, for example, receiving the request to modify the position of the wayside signal includes receiving a GPS location from an onsite marker.

In some embodiments, for example, the method includes displaying on the graphical user interface the proposed position of the wayside signal in the first block.

In some embodiments, for example, the method includes generating a visualization of the wayside signal at the proposed location.

In accordance with another broad aspect, there is provided a system for determining one or more braking distances. The system comprises a processor and a non-transitory computer-readable medium. The non-transitory computer-readable medium has computer-executable instructions stored thereon which cause the process to implement the method according any to any of the preceding embodiments.

These aspects, embodiments, and features of the systems, devices, and methods described herein may be used in various combinations, in accordance with the examples described herein.

DESCRIPTION OF THE DRAWINGS

Reference is now made to the accompanying figures in which:

FIG. 3G is an example braking report, in accordance with one or more embodiments;

It will be noted that throughout the appended drawings, like features are identified by like reference numerals.

DETAILED DESCRIPTION

The present disclosure is generally drawn to computer-implemented railway management systems and related methods. The systems and methods described herein are generally directed determining braking distances and to positioning wayside signals on a graphical user interface (GUI) during a design, installation and/or repair phase of the railway, for example. The positioning of the wayside signals on the GUI is based on calculated braking distances of one or more rail transit vehicles that may operate on the railway that the wayside signals are to be positioned beside.

The determined braking distance and/or positions of the wayside signals described herein may allow for the physical wayside signals to be installed along the physical railway at the determined positions. A wayside signal refers to any suitable electrical and/or mechanical device that is positioned at a fixed location beside a railway that rail transit vehicles may operate thereon. The wayside signals are used to direct railway traffic and used to provide an indication of when an operator or emergency systems of the rail transit vehicle should apply the brakes in order to stop the rail transit vehicle before a certain stop location (e.g., a subsequent wayside signal). A given wayside signal may include a support structure (e.g., a post, a pole, a pillar, etc.) with one or more indicators (e.g., a mechanical indicator such as a stopping sign, an electronic-based indicator, a colour light indicator, or the like). The rail transit vehicle may be a passenger train, a freight train, a subway train, a rapid transit train, a light rail train or any other suitable vehicle for transit on a railway. The railway may be referred to as a "track", "railway track" or a "railroad track", and refers to the structure that the rail transit vehicle travels thereon.

Figure 1:
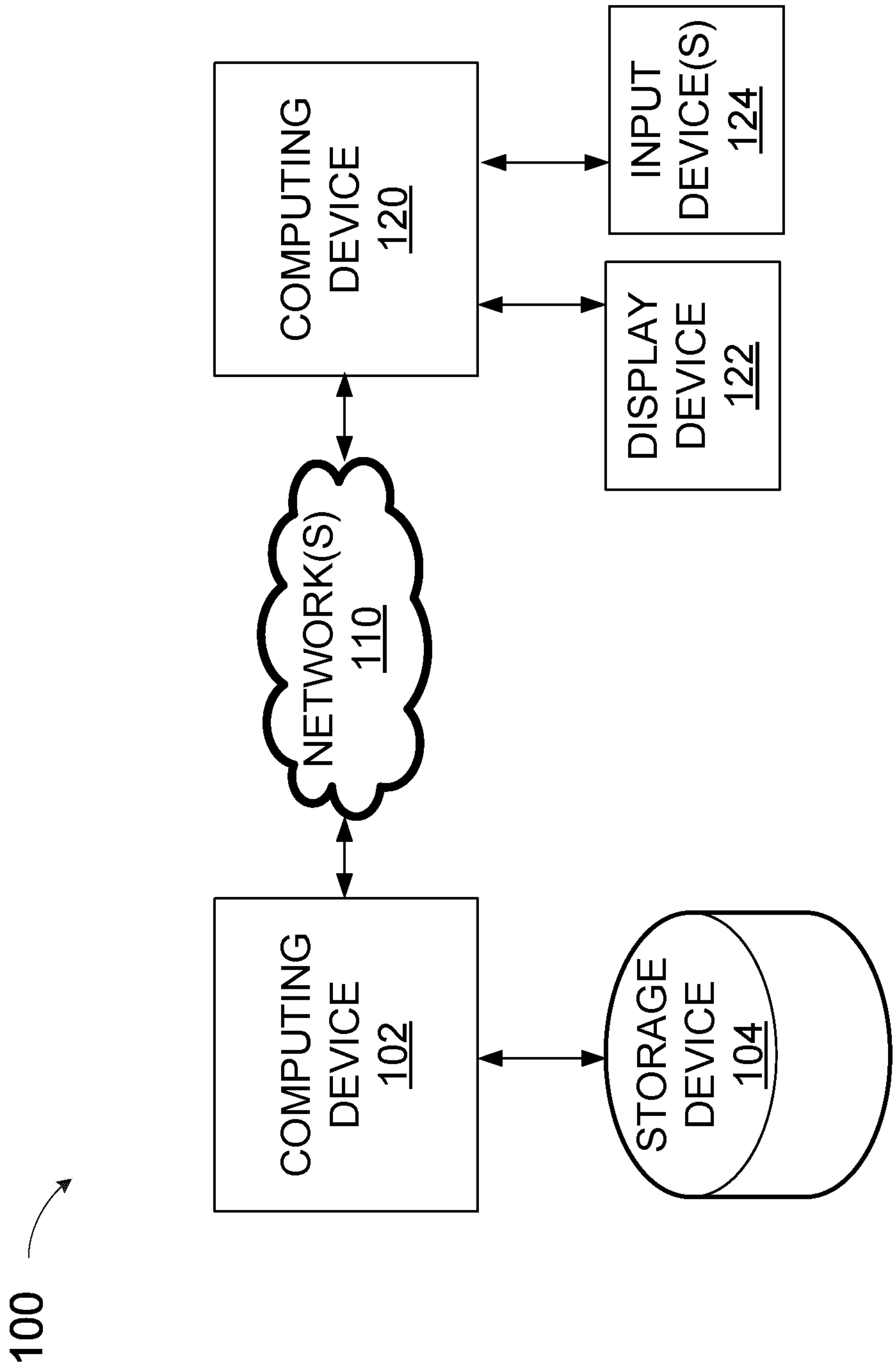
FIG. 1 is a block diagram of an example system for positioning of wayside signals, in accordance with one or more embodiments.

With reference to FIG. 1, there is illustrated a railway management system 100. A computing device 102 is configured to cause a GUI to be provided on a display device 122. A user may interact with the GUI via one or more input devices 124. The user may interact with the GUI in order to position one or more wayside signals at various locations along a railway illustrated by the GUI. The user may interact with the GUI in order to have one or more braking calculations performed to determine one or more braking distance. In other words, the computing device 102 may be configured to receive input via the user interacting with the GUI with the input device 124 to request that certain computer-implement functionally described herein be performed by the computing device 102. In some embodiments, for example, the computing device 102 is configured to receive a request to relocate the position of one or more wayside signals. The display device 122 may be any suitable display device, for example, such as a cathode ray tube display screen, a light-emitting diode display screen, a liquid crystal display screen, a touch screen, or any other suitable display device. The input device(s) 124 may include a keyboard, a mouse, a touch pad, a joy stick, a light pen, a track ball, a touch screen, or any other suitable input device for interacting with the GUI. In embodiments where the display device 122 is a touch screen device, the input device(s) 124 include the display device 122.

In the illustrated embodiment, the computing device 102 communicates with another computing device 120 over one or more networks 110 to cause the GUI to be displayed on the display device 122, as the display device 122 and the input device 124 are connected to the computing device 120. The network(s) 110 may include a public network (e.g., the Internet) and/or a private network. The network(s) 110 may include one or more of a personal area networks (PAN), local area networks (LAN), mesh networks, metropolitan area networks (MAN), wide area networks (WAN), Wi-Fi networks, cellular networks and any other suitable networks. The computing devices 102, 104 may each be any suitable computing device, such as a desktop computer, a laptop computer, a mainframe, a server, a distributed computing system, a cloud computing system, a portable computing device, a mobile phone, a tablet, or the like. By way of example, the GUI may be provided via a web browser running on the computing device 120 (e.g., a laptop computer). The web browser may send queries to the computing device 102 (e.g., a server) and receive the information for display in the web browser from the computing device 102. In alternative embodiments, the network 110 and the computing devices 120 may be omitted, such that the display device 122 and/or the input device 124 are directly connected to the computing device 102. For example, the GUI may be provided via a software application running on the computing device 102.

The computing device 102 is configured to access at least one storage device 104 including a database having stored therein railway parameters. The railway parameters are indicative of the configuration of the railway and one or more rail transit vehicles operable on the railway. The computing device 102 may obtain railway parameters based on the selected position of the wayside signal, based on the area of the railway visible in the GUI, and/or based on a selected portion of the railway. The railway parameters may include one or more of a mass of a given rail transit vehicle, a railway alignment (e.g., grade and/or curve of the railway/terrain that will support the railway, etc.), a speed limit for the railway, an expected and/or maximum speed of a given rail transit vehicle, braking performance of a given rail transit vehicle, friction of a given rail transit vehicle, rolling resistance of a given rail transit vehicle, aerodynamics of a given rail transit vehicle, environmental conditions (e.g., ambient temperature, extreme weather parameters, etc.), a positioning of one or more wayside signals beside the railway, and any other suitable information. The obtained railway parameters may be specific to the railway around the location of the selected position of the wayside signal, an area of the railway visible in the GUI and/or a selected portion of the railway. The obtained railway parameters may be design parameters based on projected construction. The computing device 102 may determine a braking distance. The computing device 102 may determine the braking distance based on the obtained railway parameters and the selected position of a given wayside signal. The braking distance refers to the length of the railway from the instant the brakes of a given rail transit vehicle are applied until the instance the that the rail transit vehicle stops. The computing device 102 may output the braking distance for presentation on the display device 122 via the GUI. The computing device 102 may determine a proposed position of one or more wayside signals for the railway based on the calculated braking distance(s). The computing device 102 may display on the GUI the proposed position of the wayside signal(s). In some embodiments, for example, the computing device 102 determines the braking distance based on the obtained railway parameters relative to a wayside signal (e.g., an exit wayside signal location), and the computing device 102 determines a proposed position of at least one other wayside signal (e.g., an entry wayside signal location) to display on the GUI based on the braking distance. An entry wayside signal refers to a wayside signal where the rail transit vehicle enters a portion of the railway. An exit wayside signal refers to a wayside signal where the rail transit vehicle may need to stop by. The rail transit vehicle may stop by the exit wayside signal when instructed by the entry wayside signal. An entry wayside signal and a corresponding exit wayside signal may be referred to as a "block". An exit wayside signal of a block may correspond to an entry wayside signal of a subsequent block. In some embodiments, for example, the user may adjust the position of a given wayside signal on the GUI, the position of one or more wayside signals may accordingly be re-determined based on the adjustment, and the new position(s) of the wayside signal(s) may be displayed on the GUI. Other configurations of the railway management system 100 are contemplated and the railway management system 100 may vary depending on practical implementations.

Figure 2A:
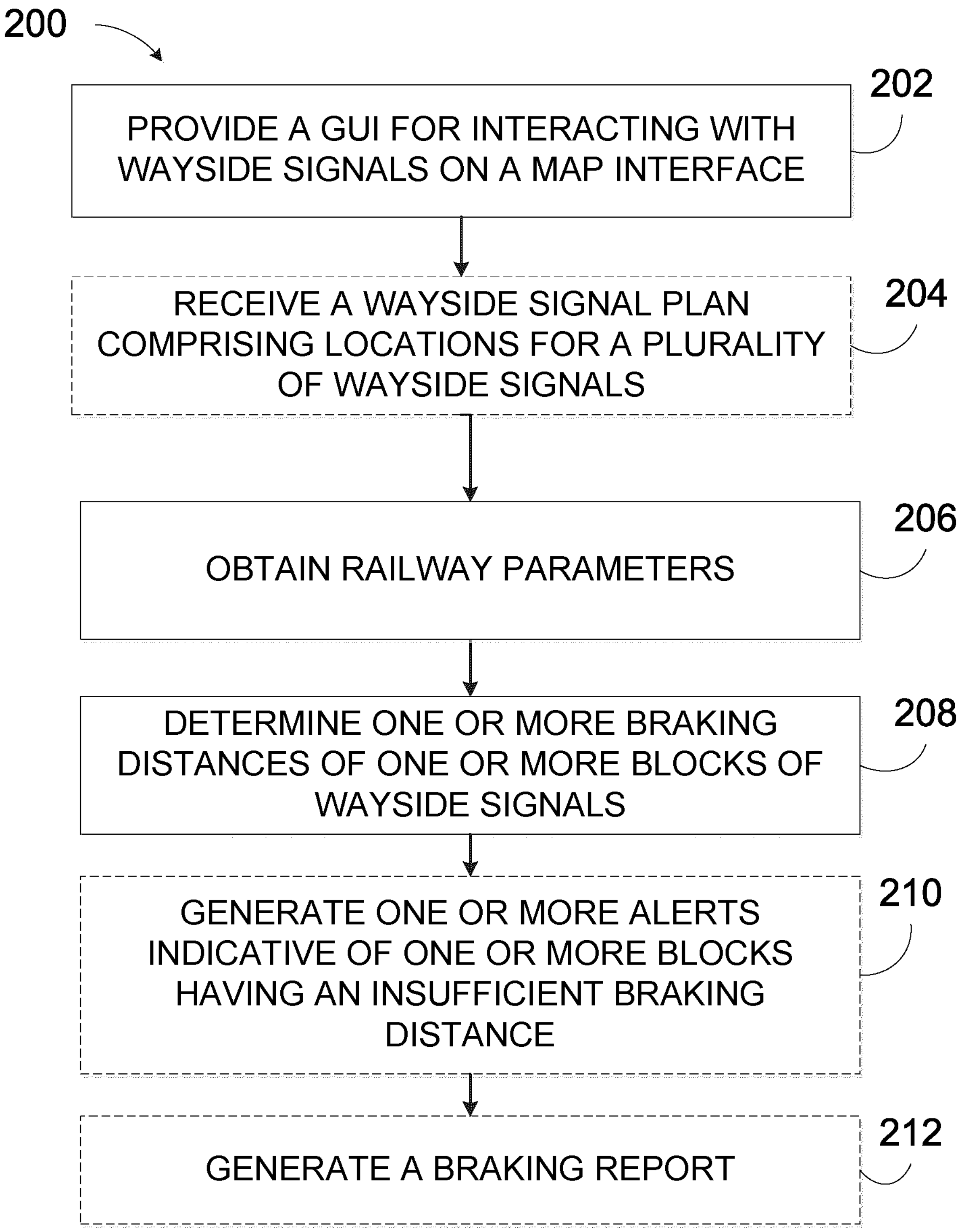
FIG. 2A is a flowchart illustrating an example method for determining one or more braking distances, in accordance with one or more embodiments.

With reference to FIG. 2A, there is shown a flowchart illustrating an example method 200 for determining at least one braking distance of a railway. The method 200 may be implemented by the system 100 and/or the computing device(s) 102, 120 or by other systems. At step 202, a GUI is provided or operated. The GUI may be provided by the computing device 120 on the display device 122. The information for display on the GUI may be provided to the computing device 120 from the computing 102 over the network 110, as shown in FIG. 1. The GUI may be provided or operated for interacting with wayside signals on a map interface. For example, a user may displace wayside signals on the map interface, as a matter of planning or installation. The map interface may be a bird's eye view (e.g., satellite, imaging, aerial imaging, digital rendering, etc.) of an area. The map interface may allow a user to set the area that is displayed. For example, the user may be able to select via the map interface a specific city, longitudinal and latitudinal coordinates, etc. The user may be able to zoom in and/or zoom out of an area via the map interface. The map interface may be as described and/or provided as part of a railway infrastructure interface described in United States Patent Application No 62/942,395, the contents of which are hereby incorporated by reference.

At step 204, in some embodiments, for example, a wayside signal plan is received. The wayside signal plan includes locations for a plurality of wayside signals. The wayside signal plan may be for indicating the locations that the wayside signals are to be physically installed. The wayside signal plan may be received by the user requesting via the GUI that a specific wayside signal plan (e.g., stored on the storage device 104) be accessed. In some embodiments, for example, step 204 may occur prior to step 202 and accordingly step 202 may include providing the GUI with the locations of the wayside signals from the wayside signal plan visible on the map interface. In some embodiments, for example, the locations of the wayside signals may already be known at the time that step 202 is performed and accordingly step 204 may be omitted. In some embodiments, for example, the user may interact with the GUI to select or modify the positions of the wayside signals in order to generate the wayside signal plan. In an embodiment, the wayside signal plan may include a sequence of blocks put end to end, whereby the displacement of a wayside signal by a user on the GUI may have an impact on the size of the adjacent block. Embodiments for selecting the positions of the wayside signals on the GUI are described elsewhere in this document.

Figure 3A:
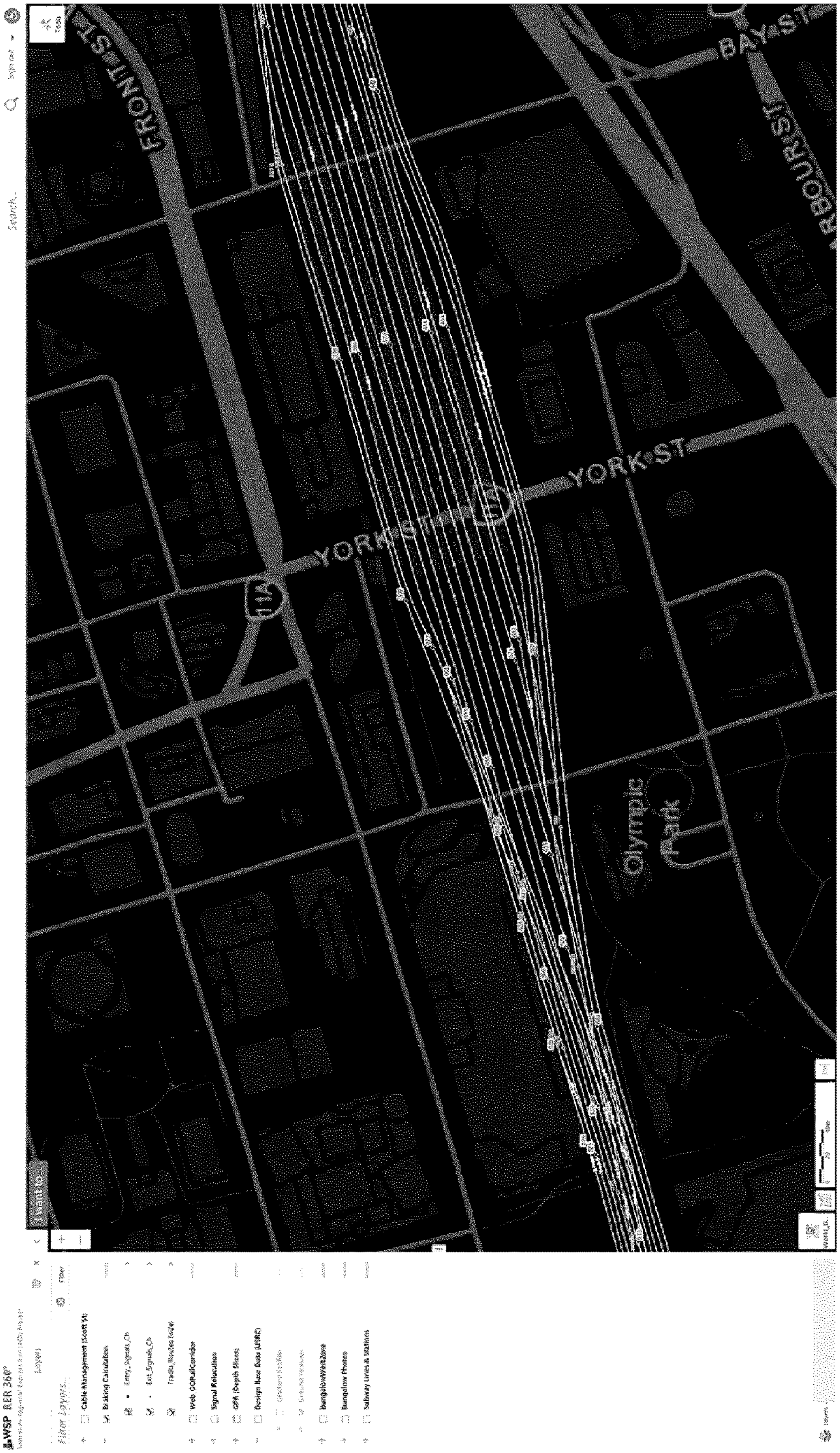
FIG. 3A is an example mapping interface illustrating wayside signals, in accordance with one or more embodiments.

The wayside signals from the wayside signal plan, or otherwise known, may be displayed on the map interface. With additional reference to FIG. 3A, an example GUI illustrates the map interface having a plurality of wayside signals provided thereon. Entry and exit wayside signal may be distinguished between each other on the map interface. The entry and exit wayside signal may be distinguished between each other by use of different colors, such as, for example, entry signals being green and exit signals being red. The wayside signals may be overlaid on the railways displayed on the map interface, as is shown in FIG. 3A. The wayside signals from the wayside signal plan, or otherwise known, may be processed by the computing device 102 to implement any of the functionality described herein.

Referring back to FIG. 2A, at step 206, railway parameters indicative of the configuration of the railway and one or more rail transit vehicles operable on the railway are obtained. The railway parameters may be obtained by the computing device 102 accessing the database(s) of the storage device 104. Any suitable railway parameters for calculating the braking distance of any block of wayside signals may be obtained.

At step 208, one or more braking distances are determined for one or more blocks of wayside signals. The braking distance between a given entry wayside signal and a given exit wayside signal in a given block may be calculated based on the railway parameters. The braking distance may be determined as a distance along the railway from the entry wayside signal towards the exit wayside signal. The braking distance may be determined considering a delay corresponding to the distance or time it would take for the brakes of a rail transit vehicle to be applied after the operator of the rail transit sees the wayside signal. The determined braking distance may be a range between a shortest and longest distance, as the braking distance may depend on varying conditions (e.g., speed of the rail transit vehicle, the type of the rail transit vehicle, mass distribution of the trail transit vehicle, ambient conditions, track gradients, etc.). The determined braking distance may be a maximum distance possible under the varying operating conditions, such as the worse possible conditions. The braking calculation may be determined using any suitable braking calculation, as known or unknown to the skilled person. The braking distance may be calculated separately for each type of rail transit vehicle that may operate on the railway. The braking distance may be provided as a distance measurement (e.g., in feet, miles, meters, kilometers, or the like). The braking distance may be provided as a percentage. The braking percentage may correspond to the distance between a given entry wayside signal and a given exit wayside signal divided by the braking distance (i.e., the distance measurement). Accordingly, a percentage above 100% would indicate that the braking distance is less than the distance between the entry and exit wayside signals, and thus that the positioning of the entry and exit wayside signals is likely sufficient for ensuring safe breaking. A percentage below 100% would indicate that the braking distance is longer than the distance between the entry and exit wayside signals, and thus that the positioning of the entry and exit wayside signals is likely insufficient for ensuring safe breaking. The braking distance may be determined for selected blocks or may be determined for all of the blocks in the wayside signal plan. The one or more braking distances may be output for presentation on the display device 122.

At step 210, in some embodiments, for example, one or more alerts are generated when one or more blocks have an insufficient braking distance. In other words, when a block has a distance between an entry and an exit wayside signal that is less than the braking distance, an alert may be generated. One alert for all of the blocks having insufficient braking distances may be displayed (e.g., listing all the blocks with insufficient braking distances). Alternatively, a respective alert for each block having an insufficient braking distance may be displayed.

At step 212, in some embodiments, for example, at least one braking report is generated. The braking report may be generated based on the braking distance, based on the railway parameters, and/or based on any other suitable information. The braking report may be generated based on request from the user. For example, the user may select on the GUI 300 that the user desires to have a braking report generated. Alternatively, the braking report may be automatically generated. The braking report may include any suitable information corresponding to one or more rail transit vehicles expected braking performance. The braking report may include the braking distances for one or more blocks of wayside signals. The braking report may indicate which blocks have insufficient braking distances. The braking report may have any other suitable information. Separate braking reports may be generated for each block. The braking report may be output, for example, displayed on the display device 122, stored in the storage device 104, printed by a printing device and/or communicated to any other suitable electronic device.

Figure 2B:
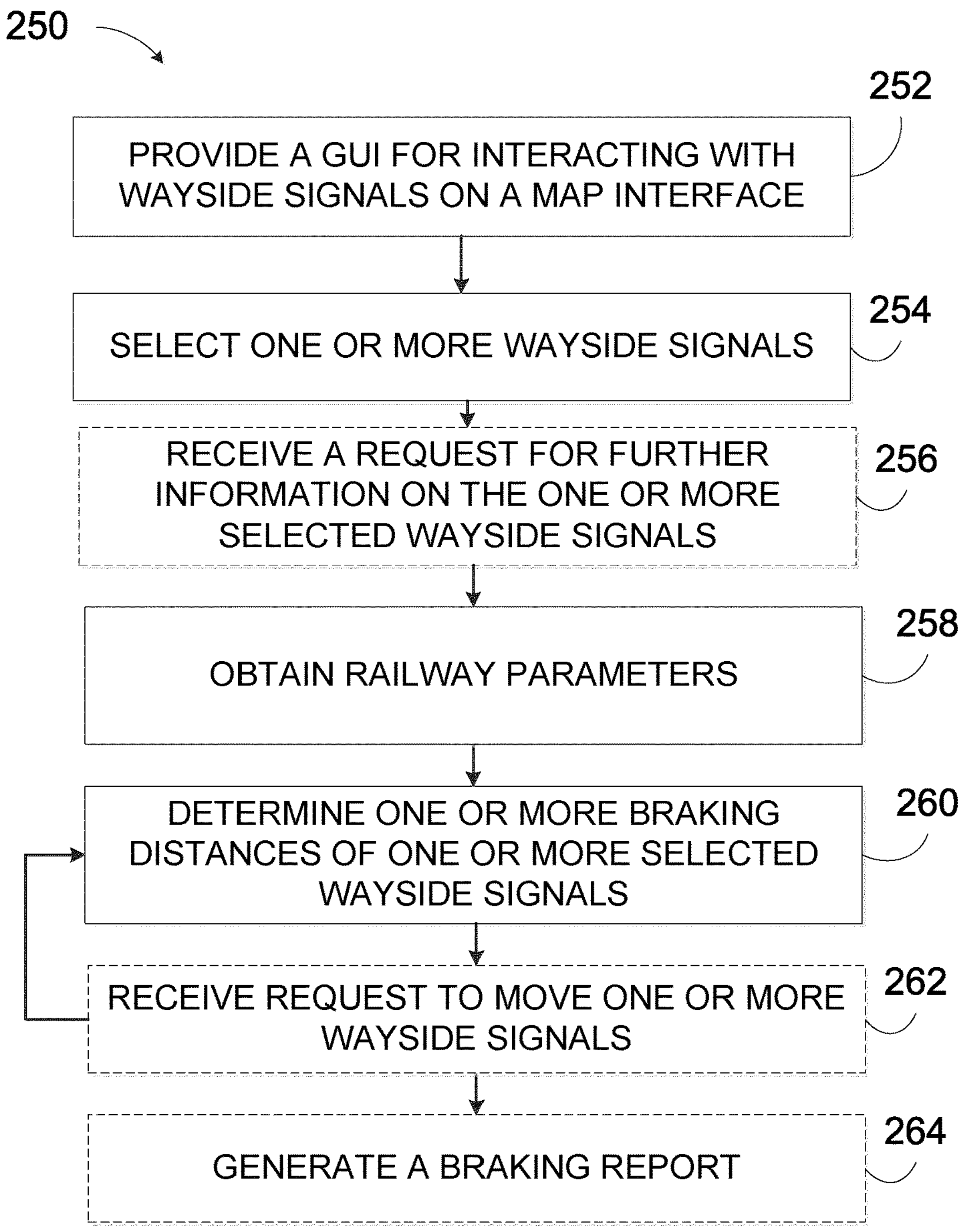
FIG. 2B is a flowchart illustrating another example method for determining one or more braking distances, in accordance with one or more embodiments.

With reference to FIG. 2B, there is shown a flowchart illustrating another example method 250 for determining at least one braking distance. The method 250 is a variant of the method 200 and it should be appreciated that aspects of the method 200 may be applicable to method 250, or vice versa. The method 200 may be implemented by the system 100 and/or the computing device(s) 102, 120 or by other systems. At step 252, a GUI is provided or operated. The GUI may be provided or operated as described elsewhere in this document. The GUI may provide the map interface. The wayside signals from the wayside signal plan, or otherwise known, may be displayed on the map interface. The GUI may be provided for selecting one or more of the wayside signals.

Figure 3B:
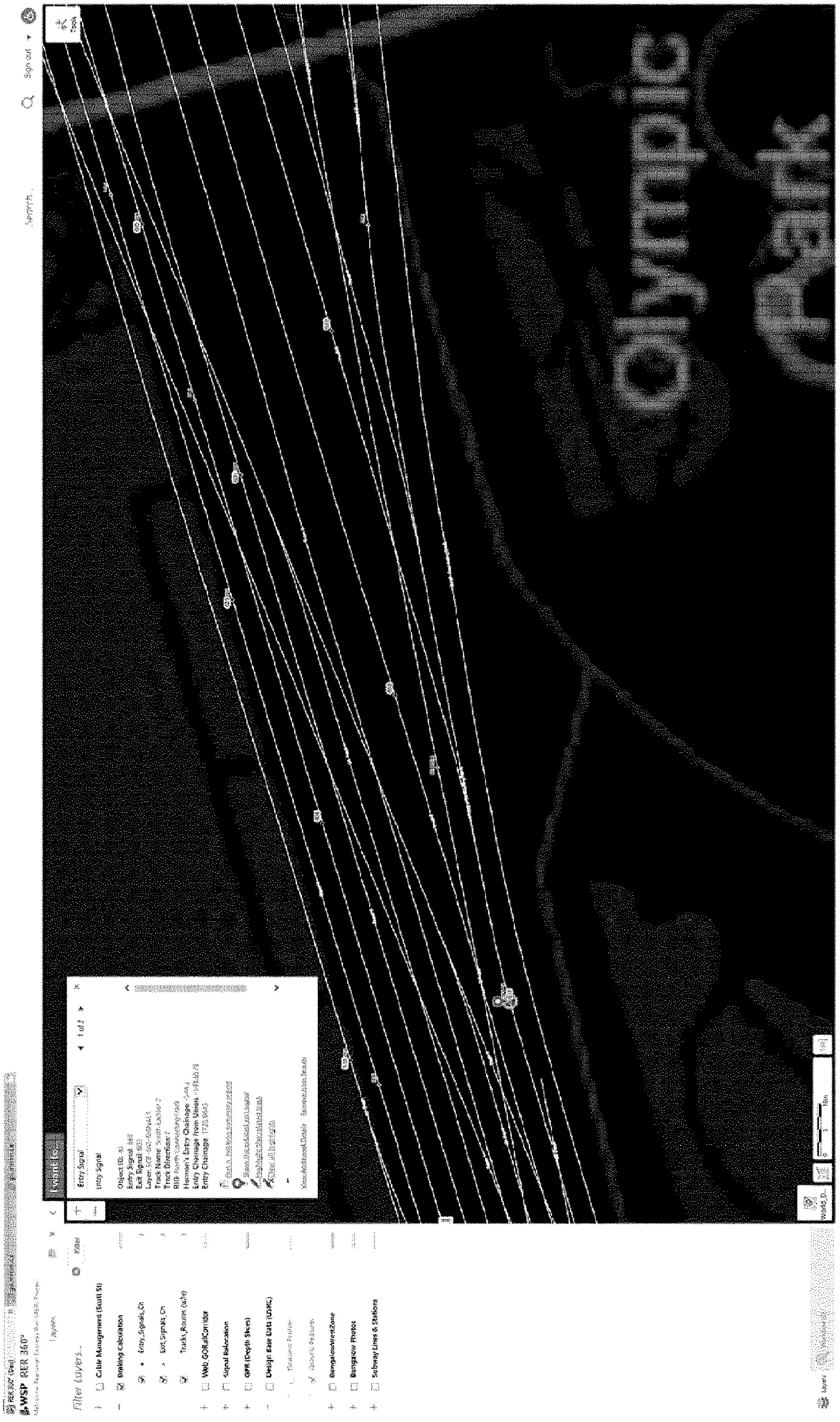
FIG. 3B is an example mapping interface illustrating an entry wayside signal being selected, in accordance with one or more embodiments.

At step 254, one or more selected wayside signals are received. The wayside signals are selected via the GUI. More specifically, the user may be able to select a given wayside signal via the map interface using the input device(s) 124. For example, the user may click on the map interface with a mouse to select a given wayside signal. By way of another example, the user may select a given wayside signal on the map interface using a touch screen. The given wayside signal may be selected in any other suitable manner. The given wayside signal may be an entry wayside signal or an exit wayside signal. In some embodiments, for example, a plurality of wayside signals are selected. With additional reference to FIG. 3B, the map interface of FIG. 3A is shown, where an entry signal is selected.

Figure 3C:
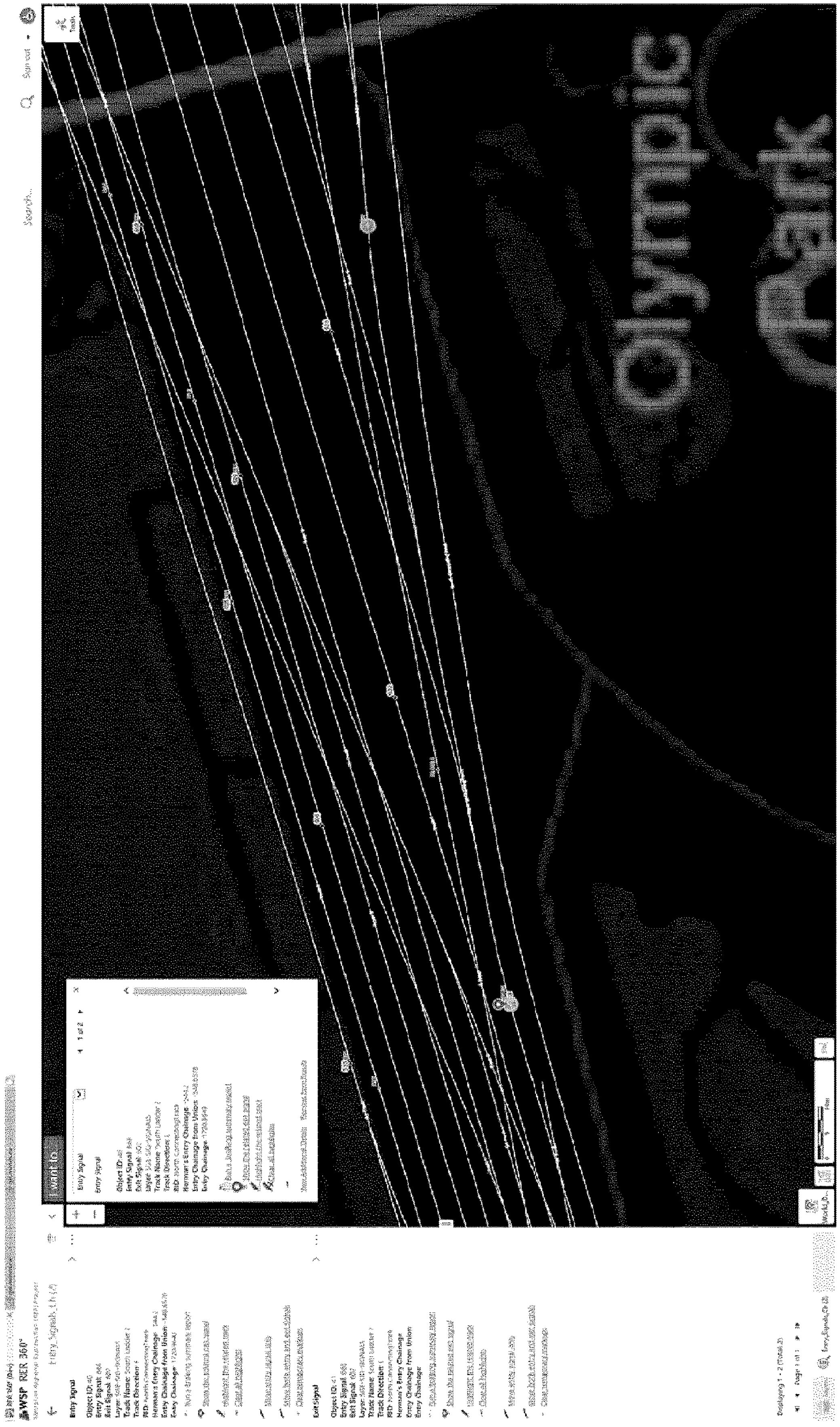
FIG. 3C is an example mapping interface illustrating a related exit wayside signal for the entry signal, in accordance with one or more embodiments.
Figure 3D:
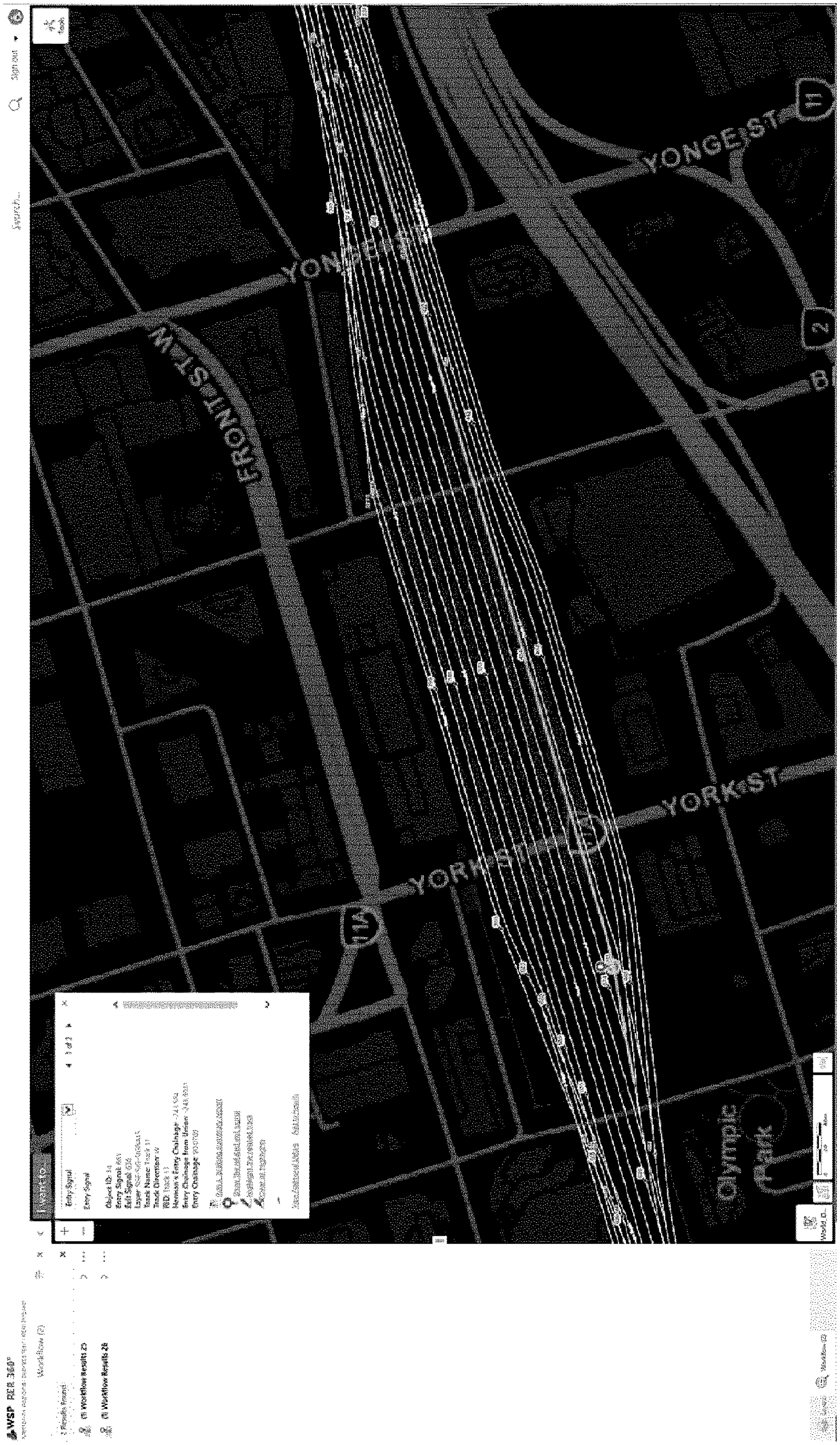
FIG. 3D is an example mapping interface illustrating a relayed railway for the entry wayside signal, in accordance with one or more embodiments.

Referring back to FIG. 2B, at step 256, in some embodiments, for example, a request for further information on the one or more selected wayside signals is received. In some embodiments, for example, the request for further information is a request that the related exit signal for the selected entry signal be identified, as is illustrated in FIG. 3C. In some embodiments, for example, the request for further information is a request that a railway for a given wayside signal (e.g., the selected entry wayside signal) be identified (e.g., highlighted), as is shown in FIG. 3D. The request for further information may vary depending on practical implementations. In some embodiments, for example, the request for further information is a request that a braking distance be determined for the selected wayside signal(s). In some embodiments, for example, the request for further information is a request that a braking report be generated for the selected wayside signal(s).

Referring back to FIG. 2B, at step 258, railway parameters are obtained. The railway parameters may be obtained based on the one or more selected wayside signals. The railway parameters may be obtained as described elsewhere in this document.

At step 260, one or more braking distances are determined for the one or more selected wayside signals. The braking distance may be determined from a given selected wayside signal. The braking distance may be determined as described elsewhere in this document. When a braking distance is insufficient an alert may be generated in similar manner as described at step 210 of method 200.

Figure 3F:
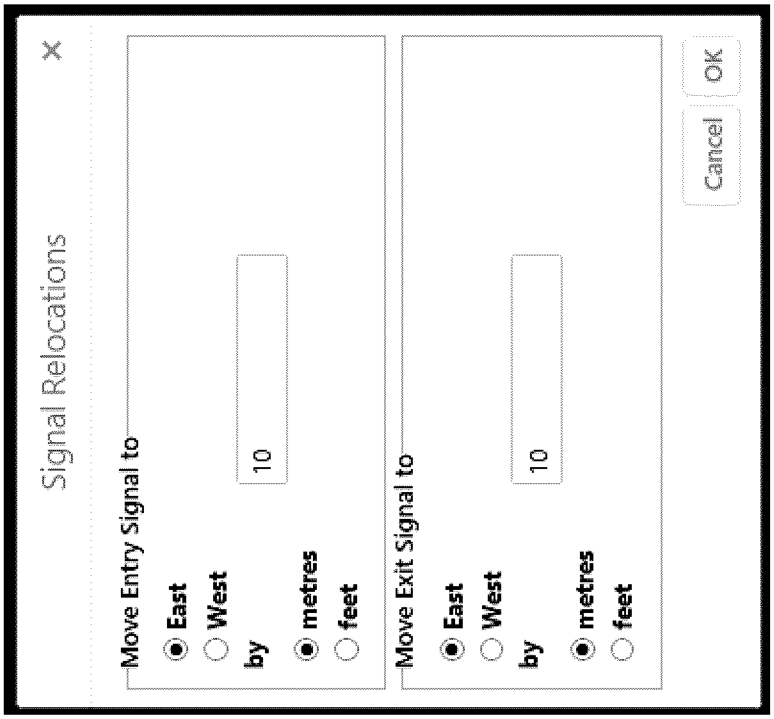
FIG. 3F is an example modal window for moving the location of an entry wayside signal and an exit wayside signal, in accordance with one or more embodiments.
Figure 3E:
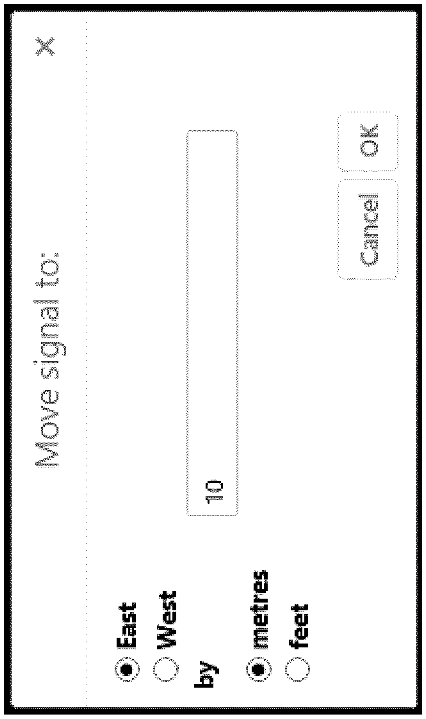
FIG. 3E is an example modal window for moving the location of a wayside signal, in accordance with one or more embodiments.

At step 262, in some embodiments, for example, a request to move the location of one or more of the selected wayside signals is received. A given wayside signal may be moved on request by the user via the GUI. The request may be to move an entry wayside signal and/or an exit wayside signal. The request to move a given wayside signal may be made by selecting the given wayside signal on the GUI and moving (e.g., dragging and dropping) the given wayside signal to a subsequent location. In some embodiments, for example, the user may provide input via a graphical control element of the GUI to move the location of a given wayside signal. The user may input the GPS coordinates to move the given wayside signal thereto. The user may input the longitudinal and latitudinal position to move the given wayside signal thereto. The user may input the distance to move a given wayside signal from its current position and/or a direction to move the given wayside signal. For example, as shown in FIG. 3E, the user may input into a graphical control element, in the form of a modal window, a distance to move a given wayside signal from its current position and a direction to move the given wayside signal.

In some embodiments, for example, the user may provide input via a graphical control element of the GUI to move a given block of wayside signals. The user may input the GPS coordinates to move a given entry and exit wayside signal. The user may input the longitudinal and latitudinal position to move a given entry and exit wayside signal. The user may input a distance to move an entry wayside signal from its current position and/or a direction of movement, and input a distance to move an exit wayside signal from its current position and/or a direction of movement. For example, as shown in FIG. 3F, the user may input into a graphical control element, in the form of a modal window, the distances and directions to move the entry and exit wayside signals.

Multiple blocks of wayside signals may be moved at the same time. For example, the user may select an area on the map interface and may select that all of the wayside signals in the area be moved. The proposed moves of the locations of the wayside signals may be stored to a temporary file. The temporary file may be processed to determine if the proposed moves are possible or not (i.e., if the braking distances are sufficient or insufficient). One or more alerts may be generated if one or more moves are not possible (i.e., one or more braking distances are insufficient). The user may be given the option to further move the wayside signals until the braking distances are sufficient. For instance, the system 100 may highlight the wayside signals of blocks that are of inappropriate size for braking, for user adjustments. The user may then select that the proposed moves in the temporary file be made to the wayside signal plan.

In some embodiments, for example, the wayside signal(s) may be automatically moved. For instance, when a given block is detected to have an insufficient braking distance, a proposed relocated position of one or more of the wayside signal may be determined by the computing device 102. The computing device 102 may then move the position of the one or more wayside signals. A prompt may be provided via GUI for allowing the user to accept or deny the change to the position of the one or more wayside signals.

As another embodiment, the subsequent location for the selected wayside signal is received in the form of a GPS location from an onsite marker. The onsite marker may be operated by an onsite worker located wayside to find accessible positions for wayside signals, notably because of local presence of power source, obstacles obstructing a clear sight of the signal (e.g., vegetation, structures, etc).

In some embodiments, for example, when one or more selected wayside signals are requested to be moved, one or more blocks of wayside signals adjacent to the selected wayside signals may also be moved. For example, when the location of a selected wayside signal is requested to be moved, one or more blocks of wayside signal adjacent to the selected wayside signal may be analyzed to determine whether the wayside signals in the adjacent blocks should also be moved. The braking distance of the adjacent blocks may be determined in view of the proposed subsequent location of the selected wayside signal. If the braking distance of any of the adjacent blocks is insufficient, proposed subsequent locations for one or more wayside signal in the adjacent blocks may be determined. The proposed subsequent locations of the wayside signals in the adjacent blocks may be adjusted automatically and displayed on the GUI and/or saved to the temporary file or the wayside signal plan. The proposed subsequent locations of wayside signals in adjacent blocks may be determined based on the subsequent location of the selected wayside signal and the braking distances of the adjacent blocks. In some embodiments, for example, one or more wayside signals may be identified on the GUI (e.g., highlighted, an alert displayed, etc.) to indicate to the user that these wayside signals in the adjacent blocks should also be moved. The user may then be given the option to accept one or more proposed subsequent locations for the wayside signals in the adjacent blocks or to manually select one or more subsequent locations for wayside signals in the adjacent blocks. The subsequent locations for wayside signals in the adjacent blocks may be stored to the temporary file and the user may then select that the proposed moves in the temporary file be made to the wayside signal plan.

Referring back to FIG. 2B, in some embodiments, for example, step 260 may be performed before step 262, and may be performed again after step 262. In other words, the braking distance(s) may be determined based on the subsequent location(s) of the wayside signal(s) received at step 262. The braking distance(s) based on the subsequent location(s) may be determined for the purpose of providing a comparison with the braking distance(s) based on the original location of the wayside signals. The braking distance(s)

may be output for presentation on the display device 122, for instance as part of a braking report, as described herein.

At step 264, in some embodiments, for example, at least one braking report is generated for the one or more selected wayside signals. The braking report may be generated as described elsewhere in this document. The braking report may be generated for the purposes of providing a comparison between braking distance a given block of signals to the same given block of signals with one or more proposed moves of the wayside signals in the block. For example, one or more proposed moves of the wayside signals in a given block may be generated based on the request at step 262 and a braking report may be generated with a summary for each of the proposed moves. With reference to FIG. 3G, an example braking report is shown. The braking report of FIG. 3G shows identifiers for a given pair of entry and exit wayside signals, the proposed moves of the entry and exit wayside signal, the distance between the current position of the entry and exit wayside signals and the distance between the proposed new position of the entry and exit wayside signals, and a move order of the wayside signals (e.g., move the exit signal first and the exit signal second). The braking report of FIG. 3G shows a summary of the braking calculations for multiple different rail transit vehicles. The braking report of FIG. 3G summaries the braking calculations for the original location of the wayside signals, for when only the entry wayside signal is moved, for when only the exit wayside signal is moved, and for when both the entry and exit wayside signals are moved. The braking report of FIG. 3G shows for each rail transit vehicles and for the different possible locations of the wayside signals, a grade percentage of the railway, a braking percentage, an original and new maximum speed, a track speed limit, and an indication if the proposed move is possible.

The wayside signal plan may be provided by way of any suitable computer-aided design (CAD) file. In some embodiments, for example, the computing device 102 may access a CAD file including the wayside signal plan. Accordingly, information for the wayside signals may be obtaining from a CAD file. The wayside signal plan (e.g., a CAD file) may be accessed upon request by the user via the map interface. For example, the user may upload the wayside signal plan (e.g., a CAD file). In some embodiments, for example, the methods and/or the systems described herein may allow for a wayside signal plan (e.g., CAD file) to be to verified. This verification of the wayside signal plan may include determining the braking distances between one or more of the wayside signals in the wayside signal plan. If the braking distance between one or more of the blocks of wayside signals is insufficient, an alert or warning may be generated and displayed on the GUI and/or insufficient braking distances may be indicated in any generated braking report.

Figure 4:
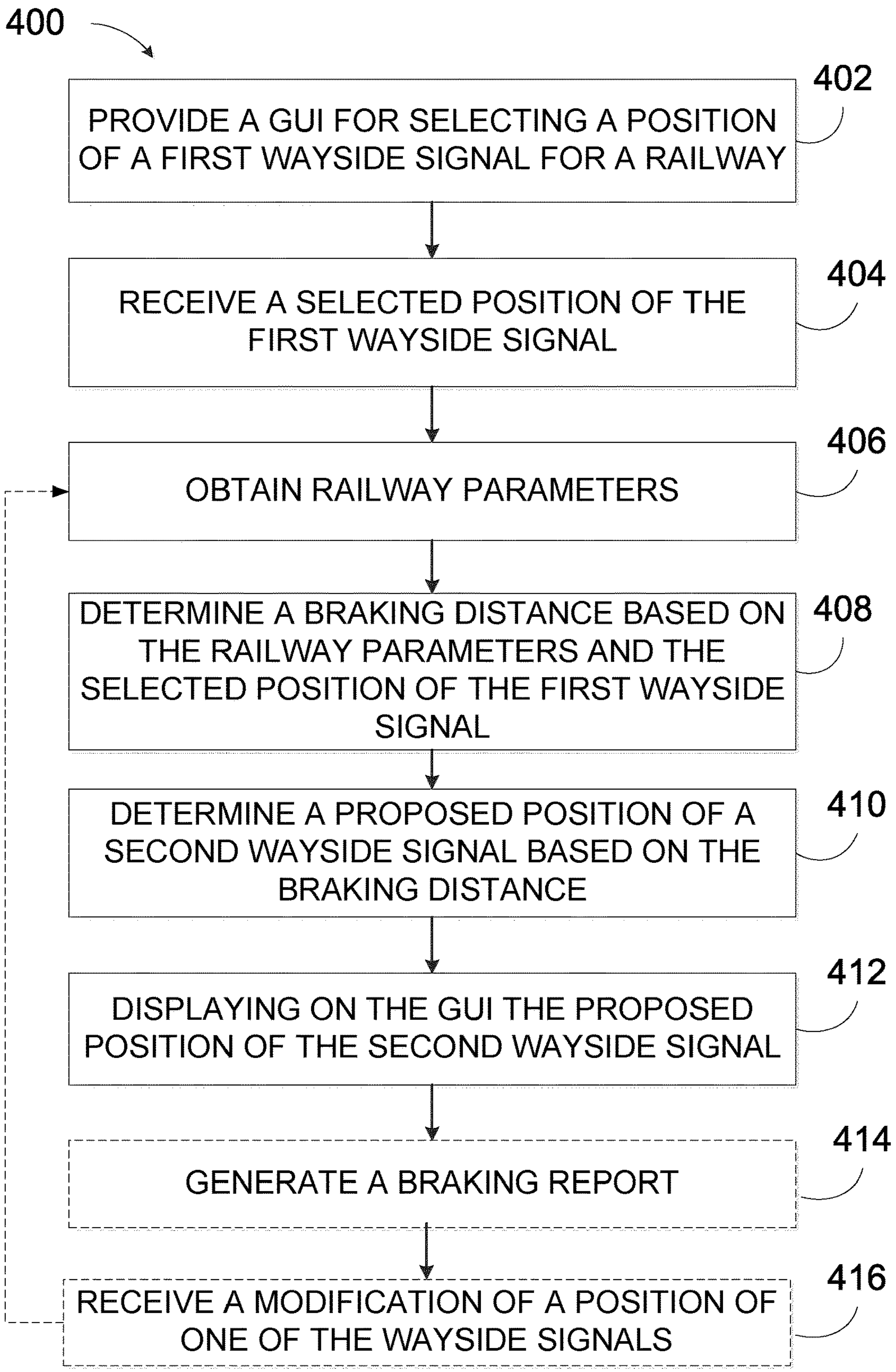
FIG. 4 is a flowchart illustrating an example method for positioning of wayside signals, in accordance with one or more embodiments.
Figure 5A:
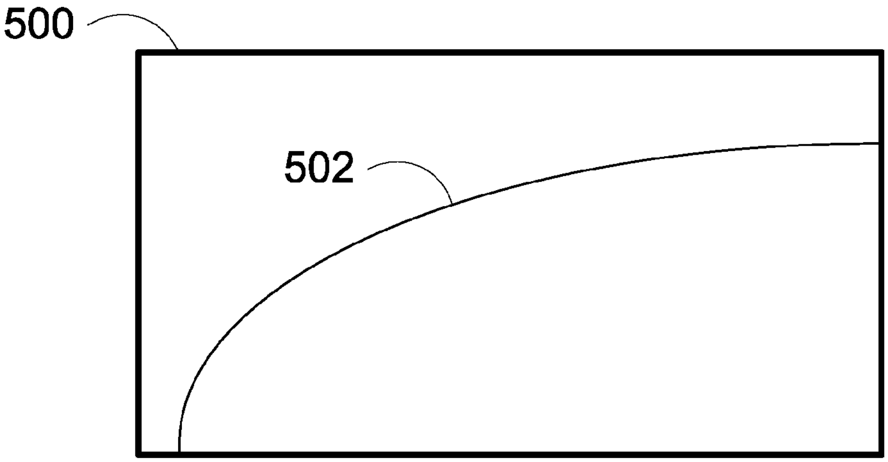
FIG. 5A to 5C are schematic diagrams of an example graphical user interface for positioning of wayside signals, in accordance with one or more embodiments.

With reference to FIG. 4, there is shown a flowchart illustrating an example method 400 for positioning of wayside signals. The method 400 may be implemented by the system 100 and/or the computing device(s) 102, 120 or by other systems. At step 402, a GUI is provided. The GUI may be provided as described elsewhere in this document. The GUI may be provided for selecting a position of a first wayside signal for a railway. The GUI may include the map interface, which may display the railway and may allow a user to interact with the GUI to select a location for possibly positioning of the first wayside signal. The first wayside signal may be an entry wayside signal or an exit wayside signal. The term "first" prior to the term "wayside signal" is used only for the purposes of distinguishing between any further wayside signals described in this document and it is to be understood that other wayside signals may already be present in the GUI. With additional reference to FIG. 5A, an example of a provided GUI 500 is illustrated. In this example, a map interface with a railway 502 is shown and the user may interact with the map interface in order to select the area of the map interface where the user may want to position the first wayside signal.

Figure 5B:
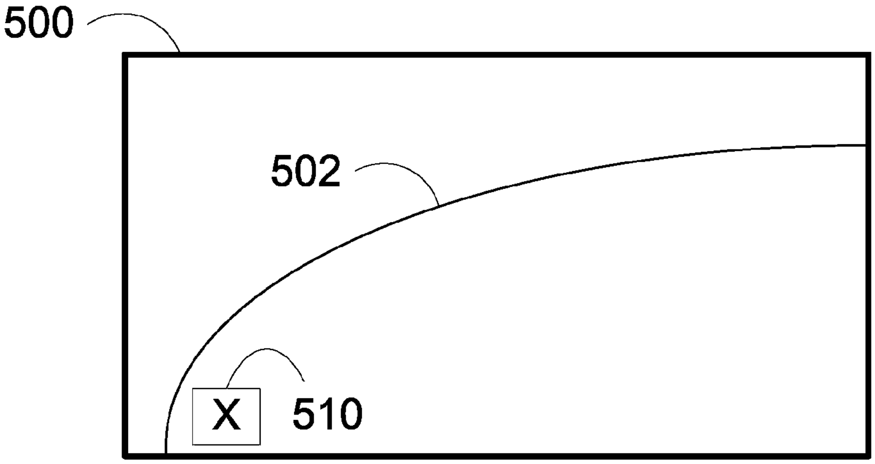

Referring back to FIG. 4, at step 404, a selected position of the first wayside signal is received. With additional reference to FIG. 5B, in this example, the user selects the position of the first wayside signal 510 on the map interface of the GUI 500. For example, the user may click on the map interface with a mouse to select the position of the first wayside signal 510. By way of another example, the user may select on the map interface using a touch screen to select the position of the first wayside signal 510. The position of the first wayside signal 510 may be selected in any other suitable manner. With reference to the railway management system of FIG. 1, the selected position may be received at the computing device 102 after being transmitted from the computing device 120 over the network 110. The selected position for the first wayside signal may be stored in the storage device of the computing device 102 and/or stored in a storage device of the computing device 120. As another embodiment, the selected position is received in the form of a GPS location from an onsite marker. The onsite marker may be operated by an onsite worker located wayside to find accessible positions for wayside signals, notably because of local presence of power source, obstacles obstructing a clear sight of the signal (e.g., vegetation, structures, etc).

Referring back to FIG. 4, at step 406, railway parameters are obtained. The railway parameters may be obtained as described elsewhere in this document. Some of the railway parameters may be obtained from the database(s) based on the selected position for the first wayside signal such that relevant parameters corresponding to the selected position for the first wayside are obtained. For example, the maximum speed of a rail transit vehicle at the selected position for the first wayside may be obtained. By way of another example, the railway alignment around the selected position for the first wayside signal may be obtained. Any suitable railway parameters for calculating a braking distance from or around the selected position for the first wayside signal may be obtained.

At step 408, a braking distance is determined based on the railway parameters and the selected positioned of the first wayside signal. The braking distance may be determined as described elsewhere in this document. The determined braking distance may be stored in the storage device of the computing device 102 and/or stored in a storage device of the computing device 120.

In some embodiments, for example, the braking distance is determined by the computing device 102 and provided to the computing device 120. In alternative embodiments, the braking distance is determined at the computing device 120 based on received railway parameters from the computing device 102. For example, program code may be run in the web browser of the computing device 102 to determine the braking distance based on the received railway parameters and the selected position of the first wayside signal. For example, JavaScript™, jQuery™, AJAX™, WebAssembly™, Silverlight™ and/or Flash™ may be used to provide the GUI and to determine the braking distance with the web browser.

Figure 5C:
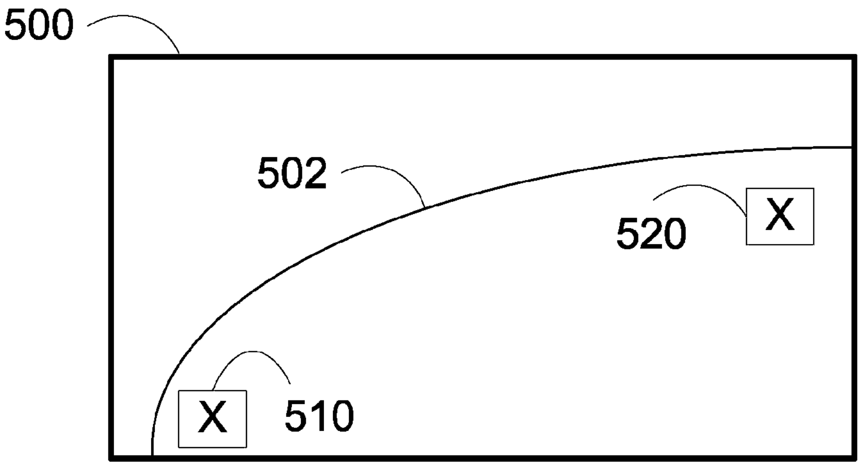

At step 410, a proposed position for a second wayside signal is determined based on the braking distance. The proposed position for the second wayside signal may be determined by determining the length of the railway from position of the first wayside signal that corresponds to at least the braking distance. For example, the proposed position for the second wayside signal may correspond to a position beside the railway at the braking distance of the railway from the position of the first wayside signal. By way of another example, the proposed position for the second wayside signal may be a position beside the railway corresponding to the braking distance of the railway from the position of the first wayside signal plus an additional offset. The proposed position may be determined to ensure that there is adequate braking distance between the first and second wayside signals. With additional reference to FIG. 5C, in this example, the proposed position for the second wayside signal 520 is displayed on the map interface. The proposed position for the second wayside signal 520 may be highlighted or may be presented in a different colour from the first wayside signal 510. The second wayside signal may be exit wayside signal or an entry wayside signal, depending on the type of wayside signal that the first wayside signal is. The term “second” prior to the term “wayside signal” is used only for the purposes of distinguishing between the “first wayside signal” described in this document. The proposed position for the second wayside signal may be stored in the storage device of the computing device 102 and/or stored in a storage device of the computing device 120.

In some embodiments, for example, at step 410, a minimum distance for the position of second wayside signal is provided and the proposed position for the second wayside signal is selected by the user. For example, the map interface of the GUI may illustrate the minimum distance for the proposed position for the second wayside signal and the user may select on the map interface where to position the second wayside signal.

Referring back to FIG. 4, in some embodiments, for example, the method 400 includes at step 414, generating a braking report. The braking report may be generated as described elsewhere in this document. The braking report may be output, for example, displayed on the display device 122, stored in the storage device 104, printed by a printing device and/or communicated to any other suitable electronic device.

In some embodiments, for example, the method 400 includes, at step 416, receiving a modification of a position of one or the wayside signals. One or more parameters may be entered into the map interface of the GUI to move the first wayside signal and/or the second wayside signal. For example, a request may be received to modify the position of the first wayside signal. Accordingly, the method 400 may return to step 406 to obtain the railway parameters based on the modified position of the first wayside signal and then proceed to step 408. Alternatively, if new railway parameters are not needed to be obtained, the method 400 may return to step 408. In this example, at step 408, the braking distance is re-determined based on the railway parameters and the modified position of the first wayside signal. Similarly, in this example, at step 410, the proposed position of the second wayside is re-determined and, at step 412, the proposed position of the second wayside signal is updated on the GUI. The braking report may also be re-generated at step 414.

By way of another example, a request may be received at step 416 to modify the position of the second wayside signal. The method 400 may then determine if the selected position of the second wayside signal is positioned within the braking distance of the first wayside signal to validate if the second wayside signal can be positioned as selected. The method 400 may make a recommendation of where to place the second wayside signal if the selected position of the second wayside signal is within the braking distance.

In some embodiments, for example, when the position of the first wayside signal is selected, the method 400 may determine if the selected position of the first wayside signal is positioned within a braking distance of a different wayside signal that is positioned before the first wayside signal to validate if the first wayside signal can be positioned as selected. The method 400 may make a recommendation of where to place the first wayside signal if the selected position of the first wayside signal is within a braking distance of a different wayside signal.

The method 400 is not limited to determining the position of the first and second wayside signals and may be used to determine the position of any suitable number of wayside signals. Accordingly, in some embodiments, for example, the method 400 includes generating a wayside signal plan including positions of a plurality of wayside signals along a railway. Each time a wayside signal is added on the mapping interface according to method 400, the wayside signal may be saved to the wayside signal plan. At step 416, if a request is received to modified the position of a given wayside signal in the wayside signal plan, the method 400 may automatically re-calculate the braking calculations of one or more wayside signals in the wayside signal plan and/or automatically adjust the position of one or more of the wayside signals in wayside signal plan based on the modification of the position of the given wayside signal.

In some embodiments, for example, the method 200, 250 and/or 400 may be performed during the physical installation of one or more wayside signals and may automatically re-calculate the positions of non-installed wayside signals once one or more wayside signals are physically installed. That is, during the installation phase, one or more of the wayside signal may need be to be installed at a different place from what was determined by the wayside signal plan that specifies where to install the wayside signals. The method 200, 250 and/or 400 may track which wayside signals are physically installed and which ones are not yet physically installed, such that when the installation location of a wayside signal is different from the position specified in the wayside signal plan, the actual installation location may be updated in the wayside signal plan and the positions of one or more of the non-installed wayside signals may be automatically updated in the wayside signal plan. The map interface of the GUI may show the various positions of the wayside signals and may illustrate the moved and/or installed locations of the wayside signals.

In some embodiments, for example, the method 200, 250 and/or 400 includes receiving a proposed location of a wayside signal in real-time and determining whether a wayside signal can be installed at the proposed position. Global positioning system (GPS) signals may be obtained in real-time and be indicative of a proposed position of a wayside signal from an on-terrain operator. The operator may move around in real-time with a portable computing device including a GPS receiver configured to receive GPS signals. The portable computing device may transmit the GPS location to the computing device 102 or 120. Alternatively, the GPS location may be inputted into the computing device 120 (e.g., laptop computer) which transmits the GPS location to the computing device 102 (e.g., a server). The computing device 102 or 120 may determine whether a wayside signal can be installed at the proposed position and cause the GUI to display an indication that a wayside signal can or cannot be installed at the proposed position. GPS location-based uploads may accordingly be used to propose relocations of wayside signals.

In some embodiments, for example, the method 200, 250, and/or 400 includes providing one or more visualizations of wayside signals. This may include providing a visualization of a wayside signal that is already installed, and/or of wayside signals proposed to be installed at particular locations. For example, the storage device 104 may have stored therein photos or other images of portions of railway at which particular wayside signals are installed. When a user selects particular wayside signals (for instance as part of step 254), the user may be able to request additional information regarding the wayside signals, which may include photos of the locations of the wayside signals. In one example implementation, the photos may be taken from the perspective of an operator of a rail transit vehicle. This may assist in determining whether the wayside signals are obscured or otherwise difficult to see from the perspective of the operator. If a photo of an installed wayside signal is not available in the storage device 104, the GUI may present a virtual visualization of the wayside signal for instance by using an existing photo of the relevant portion of the railway supplemented with a virtual representation of the wayside signal.

Figure 3H:
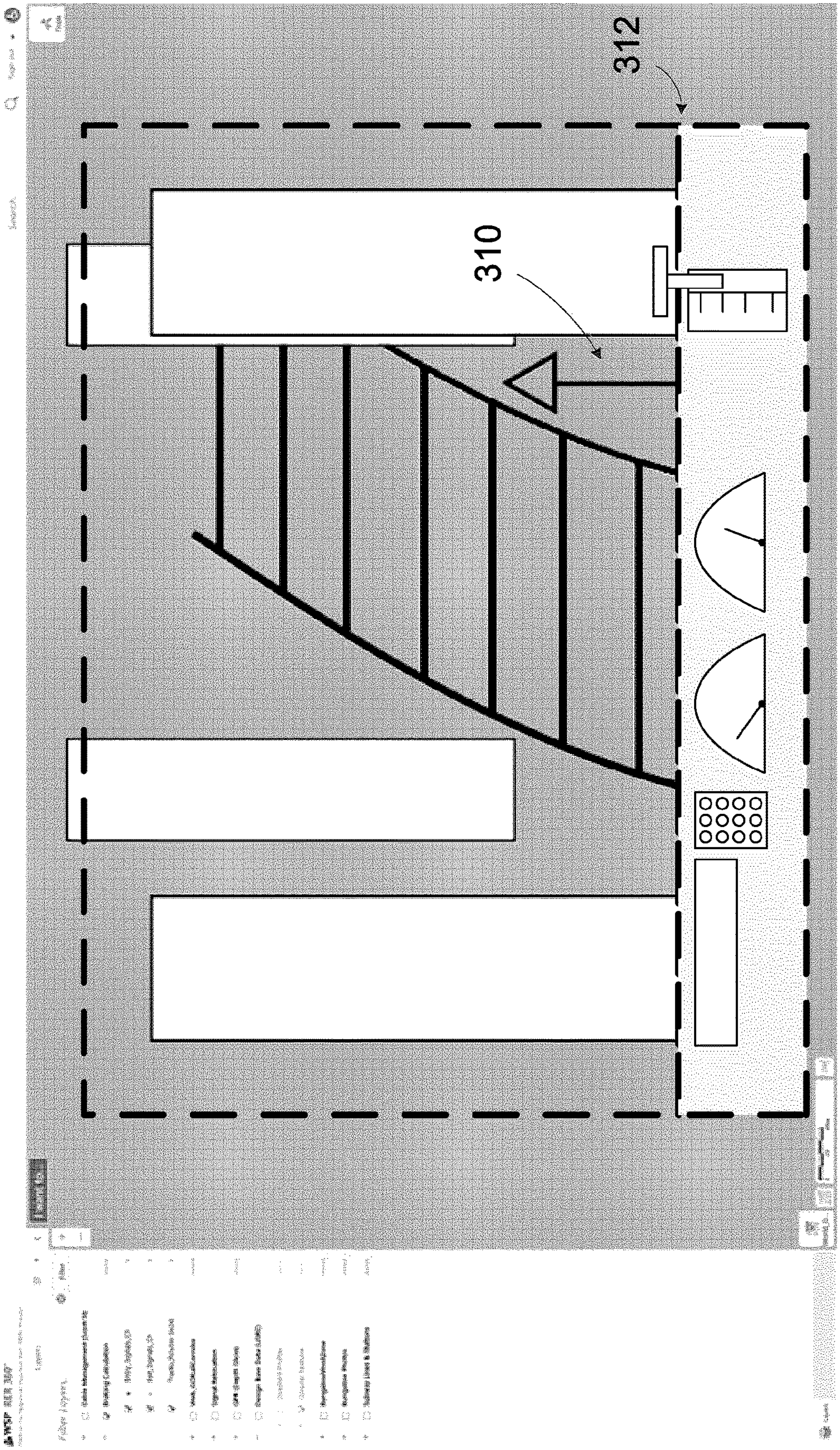
FIG. 3H is an example visualization of a wayside signal, in accordance with one or more embodiments.

By way of another example, and with reference to FIG. 3H, the position of wayside signals proposed to be installed may be visualized via the GUI. The visualization of wayside signals may be based on one or more existing images and/or one or more models of the railway. A virtual representation of the proposed wayside signal, illustrated at 310, may be incorporated into the visualization to provide the user with an indication of what the positioning of the proposed wayside signal 310 will look like once installed. In some embodiments, for example, the visualization of the proposed wayside signal 310 will be from the perspective of the operator of the rail transit vehicle, and may include a visualization of the interior of the rail transit vehicle 312 as seen by the operator when operating the rail transit vehicle. This visualization may thus include a dashboard and various controls located thereon, an outline of the field of view provided through the windshield of the rail transit vehicle, and the like. In some cases, the interior of the rail transit vehicle 312 may be toggleable via an interactive element of the GUI. In some embodiments, for example, the visualization of the proposed wayside signal 310 may be provided as part of the braking reports produced at steps 212, 264, and/or 414, or during other parts of the method 200, 250, and/or 400.

In some embodiments, for example, the method 200, 250 and/or 400 includes determining the maximum speed at which a train can operate at a given section of the railway. The maximum speed may be output as part of the braking report, as shown in FIG. 3G.

In some embodiments, for example, the method 200, 250 and/or 400 includes determining a mitigation route (i.e., a diversion to a different railway) when a rail transit vehicle needs to stop and there is not enough braking distance to the stopping point.

It should be appreciated that by implementing the methods and/or systems described herein that the manual calculation of the braking distance may be reduced and/or eliminated. It should further be appreciated that the calculating time for determining the braking distance may be reduced, which may especially be the case when wayside signals are moved during the design and/or installation phase. Also, manual calculation errors for determining the braking distance may be removed and/or eliminated. The user experience may also be improved, as the user may no longer need to manually determine the braking distance calculations. This may also allow users who do not have technical knowledge to have the braking calculations performed and determine the positions of wayside signals. A more efficient process for the designer may occurs, as the designer may not have to spend time performing manual calculations. Thus by using the methods and/or systems described herein, this may provide improved safety, reduced operational costs, and/or increased accessibility.

Figure 6:
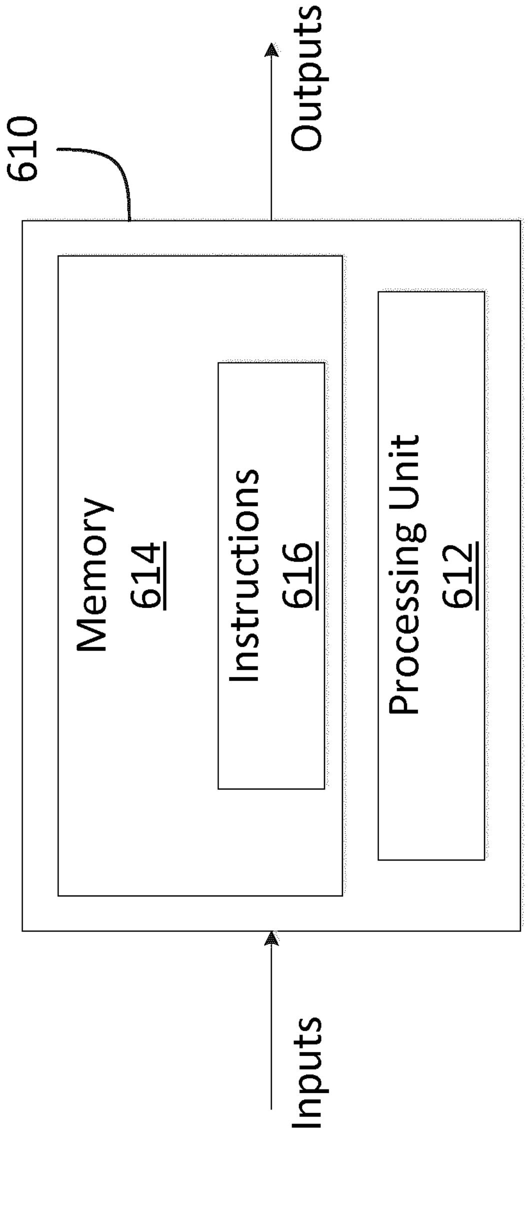
FIG. 6 is a schematic diagram of an example computing device for implementing the system of FIG. 1 and/or the method of FIG. 2A, FIG. 2B and/or FIG. 4, in accordance with one or more embodiments.

With reference to FIG. 6, the method 200, 250 and/or 400 may be implemented by a computing device 610, including a processing unit 612 and a memory 614 which has stored therein computer-executable instructions 616. The computing devices 102, 120 may be implemented according to the computing device 610. The processing unit 612 may include any suitable devices configured to implement the method 200, 250 and/or 400 such that instructions 616, when executed by the computing device 610 or other programmable apparatus, may cause the functions/acts/steps performed as part of the method 200, 250 and/or 400 as described herein to be executed. The processing unit 612 may include, for example, any type of general-purpose microprocessor or microcontroller, a digital signal processing (DSP) processor, a central processing unit (CPU), a graphical processing unit (GPU), an integrated circuit, a field programmable gate array (FPGA), a reconfigurable processor, other suitably programmed or programmable logic circuits, or any combination thereof.

The memory 614 may include any suitable known or other machine-readable storage medium. The memory 614 may include non-transitory computer readable storage medium, for example, but not limited to, an electronic, magnetic, optical, electromagnetic, infrared, or semiconductor system, apparatus, or device, or any suitable combination of the foregoing. The memory 614 may include a suitable combination of any type of computer memory that is located either internally or externally to device, for example random-access memory (RAM), read-only memory (ROM), compact disc read-only memory (CDROM), electro-optical memory, magneto-optical memory, erasable programmable read-only memory (EPROM), and electrically-erasable programmable read-only memory (EEPROM), Ferroelectric RAM (FRAM) or the like. Memory 614 may include any storage means (e.g., devices) suitable for retrievably storing machine-readable instructions 616 executable by processing unit 612.

The methods and systems described herein may be implemented in a high level procedural or object oriented programming or scripting language, or a combination thereof, to communicate with or assist in the operation of a computer system, for example the computing device 610. Alternatively, the methods and systems described herein may be implemented in assembly or machine language. The language may be a compiled or interpreted language. Program code for implementing the methods and systems described herein may be stored on a storage media or a device, for example a ROM, a magnetic disk, an optical disc, a flash drive, or any other suitable storage media or device. The program code may be readable by a general or special-purpose programmable computer for configuring and operating the computer when the storage media or device is read by the computer to perform the procedures described herein. Embodiments of the methods and systems described herein may also be considered to be implemented by way of a non-transitory computer-readable storage medium having a computer program stored thereon. The computer program may include computer-readable instructions which cause a computer, or in some embodiments the processing unit 612 of the computing device 610, to operate in a specific and predefined manner to perform the functions described herein.

Computer-executable instructions may be in many forms, including program modules, executed by one or more computers or other devices. Generally, program modules include routines, programs, objects, components, data structures, etc., that perform particular tasks or implement particular abstract data types. Typically the functionality of the program modules may be combined or distributed as desired in various embodiments.

The above description should be understood as presenting one or more example embodiments and/or implementations, and one skilled in the art will recognize that changes may be made to the embodiments described without departing from the scope of the invention disclosed. Still other modifications which fall within the scope of the present invention will be apparent to those skilled in the art, in light of a review of this disclosure.

Various aspects of the methods and systems described herein may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments. Although particular embodiments have been shown and described, it will be obvious to those skilled in the art that changes and modifications may be made without departing from this invention in its broader aspects. The scope of the following claims should not be limited by the embodiments set forth in the examples, but should be given the broadest reasonable interpretation consistent with the description as a whole.

What is claimed is:

1. A computer-implemented method for determining one or more braking distances, the method comprising:

operating a graphical user interface displaying a map with railway infrastructure having a plurality of sequentially arranged blocks, each block bounded by an entry wayside signal and an exit wayside signal, the graphical user interface for selecting a position of at least one wayside signal of a railway by displacing the at least one wayside signal relative to the railway on the map;

receiving the position of the at least one selected wayside signal via the graphical user interface;

obtaining railway parameters indicative of a configuration of the railway and one or more rail transit vehicles operable on the railway based on the at least one selected wayside signal;

responsive to displacing the at least one wayside signal, determining at least one braking distance for the block bounded by the displaced wayside signal and for each block whose braking distance is affected by the displacing, the determining being based on the railway parameters and the selected position at least one selected wayside signal; and displaying on the map of the graphical user interface the at least one braking distance for the block bounded by the displaced wayside signal and for each said said block whose braking distance is affected by the displacing.

2. The method of claim 1, including generating at least one alert indicating that the at least one braking distance is insufficient.

3. The method of claim 1, including generating a braking distance report having the at least one braking distance.

4. The method of claim 3, wherein generating the braking distance report is performed responsive to receiving a request to generate the braking report via the graphical user interface.

5. The method of claim 3, wherein generating the braking distance report having the at least one braking distance includes generating a comparison between a first braking distance associated with a first selected wayside signal and a second braking distance associated with proposed subsequent location of the first selected wayside signal.

6. The method of claim 1, wherein determining the at least one braking distance is based on at least one of operating conditions and a type of the one or more rail transit vehicles.

7. The method of claim 1, including receiving a request to move a given wayside signal of the at least one selected wayside signal, and wherein determining the at least one braking distance includes determining the at least one braking distance based on a moved location of the given wayside signal.

8. The method of claim 7, wherein receiving the request to move the given wayside signal includes receiving an input via a modal window of the graphical user interface.

9. The method of claim 7, wherein receiving the request to move the given wayside signal includes receiving a GPS location from an onsite marker.

10. The method of claim 7, including identifying at least one additional wayside signal to be moved based on the request.

11. The method of claim 10, including displaying on the graphical user interface a proposed new location for the at least one additional wayside signal to be moved.

12. The method of claim 7, including generating a visualization of the given wayside signal at the moved location.

13. The method of claim 1, wherein receiving the at least one selected wayside signal via the graphical user interface includes receiving a request via the graphical user interface to obtain the at least one selected wayside signal from a remote computing device based on a GPS signal.

14. The method of claim 1, wherein determining the at least one braking distance based on the railway parameters and the at least one selected wayside signal includes comparing a distance of the block bounded by the displaced wayside signal and the distance of each block whose braking distance is affected by the displacing, to the at least one braking distance.

15. The method of claim 14, including generating at least one alert indicating that the distance of one or more of the blocks is insufficient if the distance of the one or more of the blocks is less than the braking distance.

16. A system for determining one or more braking distances, comprising:

a processor; and a non-transitory computer-readable medium having stored thereon computer-executable instructions which cause the processor to implement the method of claim 1.

17. A computer-implemented method for positioning of wayside signals, the method comprising:

providing a graphical user interface for selecting a position of a first wayside signal for a railway having a plurality of sequentially arranged blocks, each block bounded by an entry wayside signal and an exit wayside signal;

receiving a selected position of the first wayside signal via the graphical user interface;

obtaining railway parameters indicative of a configuration of the railway and one or more rail transit vehicles operable on the railway;

determining a braking distance based on the railway parameters and the selected position of the first wayside signal for the block bounded by the first wayside signal and for each block whose braking distance is affected by the selected position;

determining a proposed position of a second wayside signal for the railway based on the braking distance, and for the entry wayside signal and/or the exit wayside signal of any of the blocks whose braking distance is affected by the selected position and/or the proposed position; and displaying on the graphical user interface the proposed position of the second wayside signal and that of the entry wayside signal and/or the exit wayside signal of any of the blocks whose braking distance is affected by the selected position and/or the proposed position.

18. The method of claim 17, including generating a braking report based on the railway parameters and the selected position of the first wayside signal.

19. A computer-implemented method for positioning of wayside signals, the method comprising:

operating a graphical user interface of a railway having a plurality of blocks, each said block having an entry wayside signal and an exit wayside signal, the blocks of the plurality being sequentially arranged;

receiving a request to modify a position of a wayside signal of a first block via the graphical user interface, to a proposed position;

obtaining railway parameters indicative of a configuration of the railway and one or more rail transit vehicles operable on the railway;

responsive to the request to modify the position, determining at least one braking distance for the first block and for each block whose braking distance is affected by the proposed position based on the railway parameters and the proposed position of the wayside signal in the first block; and displaying on the graphical user interface the at least one braking distance for the first block and for each block whose braking distance is affected by the proposed position.

* * * * *